/ United States Patent \hfill (10) Patent No.: US 10,361,087 B2
Rodriguez et al. \hfill (45) Date of Patent: Jul. 23, 2019

(54) PROCESS FOR PRODUCING AN INTERMETALLIC CONTACT BASED ON NI ON $IN_xGA_{1-x}AS$

(71) Applicant: COMMISSARIAT A L'ENERGIE ATOMIQUE ET AUX ENERGIES ALTERNATIVES, Paris (FR)

(72) Inventors: Philippe Rodriguez, Le Grand-Lemps (FR); Seifeddine Zhiou, Gafsa (TN); Fabrice Nemouchi, Moirans (FR); Patrice Gergaud, La Buisse (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 16/024,008

(22) Filed: Jun. 29, 2018

(65) Prior Publication Data

US 2019/0006182 A1 Jan. 3, 2019

(30) Foreign Application Priority Data

Jun. 29, 2017 (FR) ..................................... 17 56022

(51) Int. Cl.
*H01L 29/40* (2006.01)
*H01L 21/283* (2006.01)
(Continued)

(52) U.S. Cl.
CPC ...... *H01L 21/283* (2013.01); *H01L 21/28575* (2013.01); *H01L 29/401* (2013.01); *H01L 29/41725* (2013.01); *H01L 29/452* (2013.01)

(58) Field of Classification Search
CPC ............. H01L 21/283; H01L 21/28575; H01L 21/28229; H01L 21/28264;
(Continued)

(56) References Cited

U.S. PATENT DOCUMENTS

2011/0084320 A1\* 4/2011 Jung ................. H01L 21/28512
257/288
2013/0052805 A1\* 2/2013 Previtali ................. H01L 21/84
438/478

OTHER PUBLICATIONS

Rabhi, et al., "Phase formation between Ni thin films and GaAs substrate", Scripta Materialia, vol. 141, pp. 28-31, Jul. 22, 2017.
(Continued)

*Primary Examiner* — Chuong A Luu
(74) *Attorney, Agent, or Firm* — Baker & Hostetler LLP

(57) ABSTRACT

A process for manufacturing an intermetallic contact on the surface of a layer or of a substrate of oriented $In_xGa_{1-x}As$ material, the contact includes an Ni—InGaAs intermetallic compound, the intermetallic compound having a hexagonal crystallographic structure that may have: a first texture or a second texture formed at a second nucleation temperature above the first nucleation temperature; the process comprising the following steps: the production of nomograms defining, for a thickness of Ni deposited, the time to completely consume the initial thickness of Ni as a function of the annealing temperature, the annealing temperature being below the nucleation temperature of the second texture; the localized deposition of Ni on the surface of the $In_xGa_{1-x}As$ material; an annealing step applying the pair of parameters: time required/annealing temperature, deduced from the nomograms, comprising at least one temperature rise step and at least one temperature hold of the final annealing temperature.

16 Claims, 14 Drawing Sheets

(51) Int. Cl.
  *H01L 29/45* (2006.01)
  *H01L 21/285* (2006.01)
  *H01L 29/417* (2006.01)

(58) Field of Classification Search
  CPC . H01L 2224/08503; H01L 2224/16503; H01L 2224/16507; H01L 2224/32507; H01L 2224/32503; H01L 2224/40507; H01L 2224/48507; H01L 2224/8081; H01L 2224/8181; H01L 2224/8281; H01L 2224/8381; H01L 2224/8481; H01L 2224/8581; H01L 2224/8681
  USPC .......................................................... 257/295
  See application file for complete search history.

(56) References Cited

OTHER PUBLICATIONS

Chuang, et al., "An Electrical Method to Characterize Thermal Reactions of Pd/GaAs and Ni/GaAs Contacts", Journal of Electronic Materials, vol. 24, No. 6, pp. 767-772, 1995.

Ghegin, et al., "Metallurgical Studies of Integrable Ni-based Contacts for Their Use in III-V/Si Heterogeneous Photonics Devices", Silicon Nanoelectronics Workshop (SNW), 2016.

Kim, et al., "Sub-60-nm Extremely Thin Body InxGa1—xAs-On-Insulator MOSFETs on Si With Ni—InGaAs Metal S/D and MOS Interface Buffer Engineering and Its Scalability", IEEE Transactions on Electron Devices, vol. 60, No. 8, pp. 2512-2517, Aug. 2013.

Shekhter, et al., "Epitaxial NiInGaAs Formed by Solid State Reaction on In0.53Ga0.47As: Structural and Chemical Study", Journal of Vacuum Science & Technology B, vol. 31, Issue 3, 2013.

Solomon, et al., "Auger Sputter Profiling and Factor Analysis of Thermally Treated Ni—GaAs Structures: The Influence of Oxygen on Compounding and Diffusion", Journal of Vacuum Science & Technology A 5, 1809 (1987).

Zhiou, et al., "Reaction of Ni film with In0.53Ga0.47As: Phase formation and texture", Journal of Applied Physics, American Institute of Physics, vol. 120, No. 13, Oct. 4, 2016, XP012212419.

Perrin, et al., "Formation of Ni3InGaAs phase in Ni/InGaAs contact at low temperature", Applied Physics Letters, A I P Publishing LLC, vol. 109, No. 13, Sep. 26, 2016, XP012212253.

Ivana, et al., "Crystal structure and epitaxial relationship of NiInGaAs films formed on InGaAs by annealing", Journal of Vacuum Science & Technology B: Microelectronics and Nanometer Structures, American Institute of Physics, vol. 31, No. 1, Jan. 1, 2013, pp. 12202-1-12202-8, XP012172447.

Ashizawa, et al., "Thermal stability of interfaces between metals and InP-based materials", Journal of Electronic aterials, vol. 25, No. 4. pp. 715-519, 1996.

* cited by examiner

PROCESS FOR PRODUCING AN INTERMETALLIC CONTACT BASED ON NI ON $In_xGa_{1-x}As$

CROSS-REFERENCE TO RELATED APPLICATIONS

This application claims priority to foreign French patent application No. FR 1756022, filed on Jun. 29, 2017, the disclosure of which is incorporated by reference in its entirety.

FIELD OF THE INVENTION

The field of the invention is that of components made of III-V materials and more precisely that of $In_xGa_{1-x}As$ components with $0 \leq x \leq 1$, comprising the production of intermetallic contacts.

BACKGROUND

FIG. 1 thus illustrates an example of a transistor comprising an $In_xGa_{1-x}As$ channel highlighting the source, the gate and the drain, requiring the making of contacts. FIG. 2 illustrates another type of configuration for photonic applications that also requires the making of contacts and in which the present invention may be particularly of interest.

Contacts on $In_xGa_{1-x}As$ with $0 \leq x \leq 1$ that are compatible with a Si-CMOS technology are generally produced by solid-state reaction between a metal (Ni) or a metal alloy $Ni_yM_{1-y}$ and the semiconductor (InGaAs) as described in the publication by S. H. Kim et al., IEDM 2010, 26.6.

This reaction, carried out between 200° C. and 500° C. by rapid annealing in a controlled atmosphere results in an Ni—InGaAs intermetallic compound being obtained, as described in the publication by Ivana et al., J. Vac. Sci. Technol., B 31 (2013) 012202 and in the publication by P. Shekter et al., J. Vac. Sci. Technol., B 31 (2013) 031205, which can be used for the making of S/D contacts of the transistor as described in the publication by S. H. Kim et al., IEEE Trans. Electron. Devices 60 (2013) 2512 or to contact the electrode used for electrical pumping of the laser as described in the publication by E. Ghegin et al., IEEE Silicon Nanoelectronics Workshop 2016, 214.

To date, the nature of the phases and of the textures obtained during the solid-state reaction between Ni and InGaAs was not properly known as described in the publication by S. Zhiou et al., J. Appl. Phys. 120 (2016) 13530.

Yet control of the latter may result in an optimized intermetallic compound being obtained, which inter metallic compound is optimized in particular in terms of morphological stability, thickness and contact resistivity enabling a control of the production of the contacts.

This is why in this context the present invention relates to a process for manufacturing an optimized intermetallic contact.

The Applicant proposes a process that makes it possible to control the phases and the textures of the Ni—InGaAs intermetallic compound, based on an in-depth study of the solid-state reaction between the Ni metal and the $In_xGa_{1-x}As$ compound with $0 \leq x \leq 1$, this being in order to favor:
- a texture that results in an optimized contact interface and an optimized morphology;
- a hexagonal phase with well-defined stoichiometry which is favorable in terms of contact resistivity.

SUMMARY OF THE INVENTION

The advantage of the present invention lies in the fact of carrying out a process for obtaining an intermetallic compound that makes it possible to remain below the nucleation barrier of the unfavorable texture while not all the Ni has been consumed.

Compared to the prior art, the present invention provides a solution that makes it possible to reproducibly control the morphology of the contacts through control of the texture and of the phase and therefore to favor a lower resistivity.

The present invention relates to a process that, by a thermal annealing operation calibrated as a function of the thickness of nickel deposited, makes it possible to only form one type of desired first texture while avoiding forming an undesirable second texture as will be explained and expanded upon in the detailed description of the present application.

More specifically, one subject of the invention is a process for manufacturing an intermetallic contact on the surface of a layer or of a substrate of (100) oriented $In_xGa_{1-x}As$ material with $0 \leq x \leq 1$, said contact comprising an Ni—InGaAs intermetallic compound, said intermetallic compound having a hexagonal crystallographic structure that may have:
a first texture, of which $(10\bar{1}0)$ planes of the intermetallic compound are parallel to the surface of said layer or of said substrate, and which is formed at a first nucleation temperature or
a second texture, of which the (0001) planes of the intermetallic compound are parallel to the (111) planes of said layer or of said substrate, and which is formed at a second nucleation temperature above said first nucleation temperature;

said process comprising the following steps:
the production of nomograms defining, for a thickness of Ni deposited on said $In_xGa_{1-x}As$ material, the time required to completely consume the initial thickness of Ni deposited on said $In_xGa_{1-x}As$ material as a function of the annealing temperature, said annealing temperature being below said nucleation temperature of said second texture;
the localized deposition of Ni on the surface of said $In_xGa_{1-x}As$ material in order to form a layer of Ni having a contact thickness;
an annealing step applying the pair of parameters: time required/annealing temperature, deduced from said nomograms in correlation with said contact thickness so as to form, by solid-state reaction, a layer of intermetallic compound of first texture, said annealing step comprising:
at least one temperature rise step with a given temperature rise rate that makes it possible to achieve a final annealing temperature $T_p$ and
at least one temperature hold of said final annealing temperature $T_p$, for a hold time $\Delta t_p$.

Advantageously, the temperature rise rate is determined as being below a maximum rate $V_{max}$, said maximum rate depending on the kinetics of the texture that is formed.

Advantageously, the maximum annealing rate (in ° C./min) corresponds to the following equation as a function of the thickness of Ni deposited (in nm):

$$V_{max} = 12314.7x^{-1.91582}$$

Advantageously, the process of the invention may comprise, regarding the annealing step:
a first temperature rise step with a first temperature rise rate that makes it possible to achieve a first annealing temperature $T_{1r}$;
a second temperature rise step with a second temperature rise rate that makes it possible to achieve, from said first annealing temperature, a final annealing temperature $T_p$;

at least one temperature hold of said final annealing temperature $T_p$, for a hold time $\Delta t_p$.

Advantageously, the molar fraction x of the substrate is between 0.25 and 0.80.

According to variants of the invention, the process comprises a first annealing at a first temperature for a first time in order to form a first intermetallic compound of first texture and having a first phase and a second annealing at a higher temperature than said first temperature in order to form a second intermetallic compound of first texture and having a second phase.

The Ni—InGaAs intermetallic compound may typically be an $Ni_2InGaAs$ compound or an $Ni_3InGaAs$ compound.

According to variants of the invention, the process comprises an annealing carried out at a temperature between 200° C. and 320° C., in order to form the first texture A, with a preference for the range 240° C. and 290° C., for a time dependent on the thickness of Ni deposited, in order to form an $Ni_3InGaAs$ intermetallic compound.

Typically, for an initial thickness of Ni of between a few nanometers and a few tens of nanometers, the annealing time may vary between a few minutes and a few tens of minutes.

According to variants of the invention, said annealing carried out at a temperature between 200° C. and 320° C., with a preference for the range 240° C. and 290° C., is followed by an annealing carried out at a temperature between 250° C. and 550° C. in order to modify the resistivity of said intermetallic contact formed.

According to variants of the invention, said annealing carried out at a temperature between 200° C. and 320° C., with a preference for the range 240° C. and 290° C., is followed by an annealing carried out at a temperature between 300° C. and 500° C. in order to consolidate the $Ni_3InGaAs$ phase (in the low range) or to form the $Ni_2InGaAs$ phase (in the high range).

It should be noted that the two $Ni_3InGaAs$ and $Ni_2InGaAs$ phases have the same structure with variable compositions depending on the degree of occupation of the interstitial sites, the $Ni_2InGaAs$ phase being the most stable phase at high temperature (350-500° C.).

According to variants of the invention, the nomograms are produced by measuring the intermetallic compound thicknesses formed as a function of time.

According to variants of the invention, the thickness measurements are performed by x-ray reflectivity.

According to variants of the invention, the thickness measurements are performed by ellipsometry.

According to variants of the invention, the process comprises the deposition of a protective layer on the surface of the localized deposition of Ni, prior to the annealing operation(s).

Another subject of the invention is the intermetallic contact obtained according to the process of the invention.

A further subject of the invention is a process for manufacturing a transistor comprising the process for manufacturing an intermetallic contact of the invention.

Another subject of the invention is a process for manufacturing a photonic component comprising the process for manufacturing an intermetallic contact of the invention.

BRIEF DESCRIPTION OF THE DRAWINGS

A better understanding of the invention will be obtained and other advantages will become apparent on reading the description which will follow, given without limitation, and by virtue of the figures, among which.

DETAILED DESCRIPTION

Generally, when an intermetallic contact is produced from the deposition of Ni on the surface of an $In_xGa_{1-x}As$ layer or substrate, the solid-state reaction between Ni and $In_xGa_{1-x}As$ results in the obtention of several Ni—InGaAs intermetallic compounds having a hexagonal B8 crystallographic structure. Like certain intermetallic compounds, this hexagonal phase has 2 textures (A and B) which are characterized by their orientations relative to the substrate.

For the texture A, the $(10\bar{1}0)$ planes of the intermetallic are parallel to the surface (when the latter is oriented along the (100) planes) of the $In_xGa_{1-x}As$ layer or substrate whereas for the texture B it is the (0001) planes which are parallel to the (111) planes of said surface.

Figure 1:
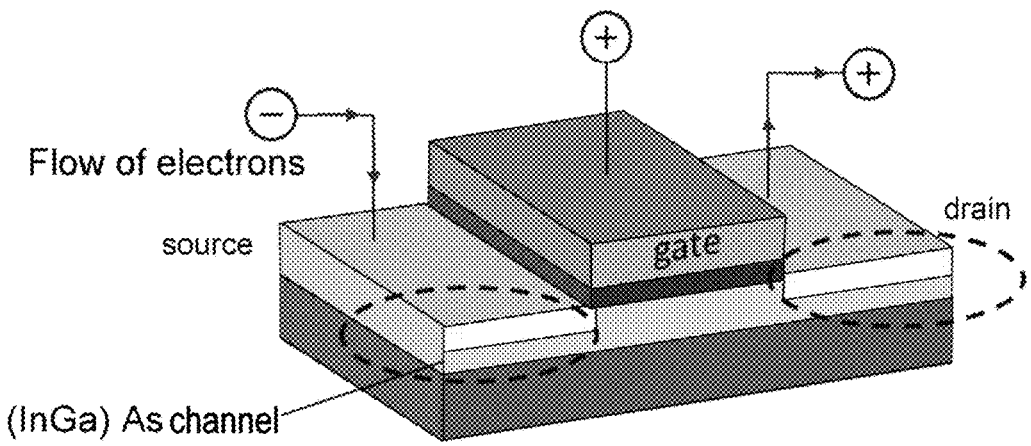
FIG. 1 illustrates an example of a transistor structure according to the known art that may comprise intermetallic contacts.
Figure 2:
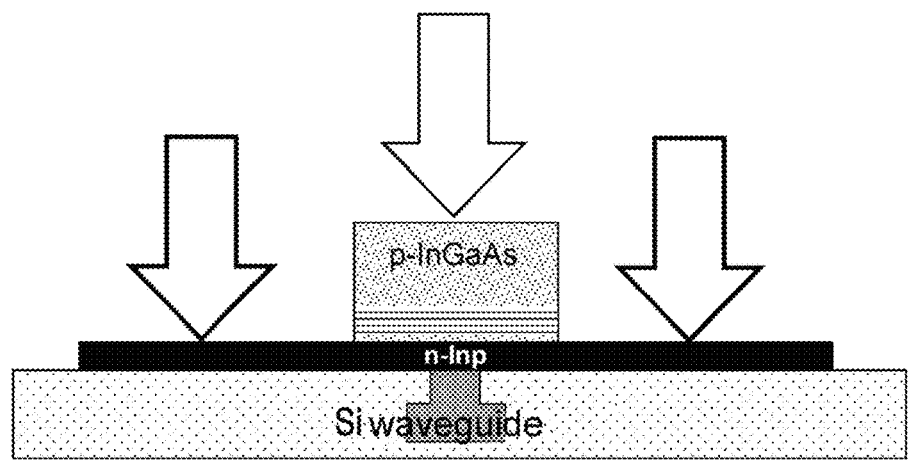
FIG. 2 illustrates an example of a photonic structure according to the known art that may comprise intermetallic contacts.
Figure 3:
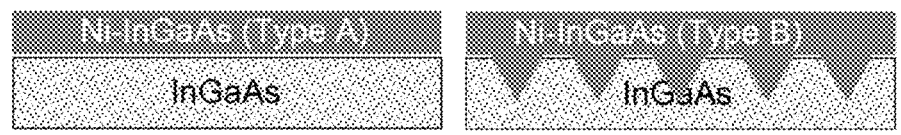
FIG. 3 depicts the two textures of the Ni—InGaAs intermetallic compound that may be obtained during an annealing operation.

This results in the first case in the obtention of a hexagon, the axis c of which is perfectly parallel to the surface of the layer or substrate (texture A) and therefore a perfectly flat Ni—InGaAs/$In_xGa_{1-x}As$ interface, and in the other case in a hexagon which is oriented along the (111) planes of the layer or substrate giving a very rough interface that may result in electrical defects (junction breakdown, increase in contact resistivity). This is depicted in FIG. 3.

The Applicant has carried out experiments that make it possible to demonstrate that the texture of the intermetallic compound can be controlled by the thermal budget or the thickness of metal (if the thermal budget has been set) used during the solid-state reaction between the Ni and $In_xGa_{1-x}As$ and has concluded that it is advisable to consume all of the Ni before exceeding the nucleation temperature of the texture B. This temperature is between 200° C. and 320° C., with a preference for the range 240° C. and 290° C. according to the content of In in $In_xGa_{1-x}As$.

The annealing time to be applied in order to totally consume the Ni depends on the annealing temperature and on the initial thickness of Ni deposited.

According to present invention, it is proposed to produce nomograms that make it possible to determine, as a function of the initial thickness of Ni and of the annealing temperature, the time required to consume all the Ni.

More specifically, the Applicant has demonstrated the influence of the annealing operation on the formation of the desired texture, without forming the undesirable texture, this being by controlling the temperature rise rate in order to achieve the desired annealing temperature referred to as final annealing temperature, and maintaining this temperature during a hold, this being as a function of the thickness of nickel.

The Applicant has studied two possible annealing options, respectively relating to:
an annealing step having a temperature ramp 1 and a hold, corresponding to the simplest option;
an annealing step having a ramp 1, followed by a ramp 2 and a hold, corresponding to a more industrializable option.

Figure 4A:
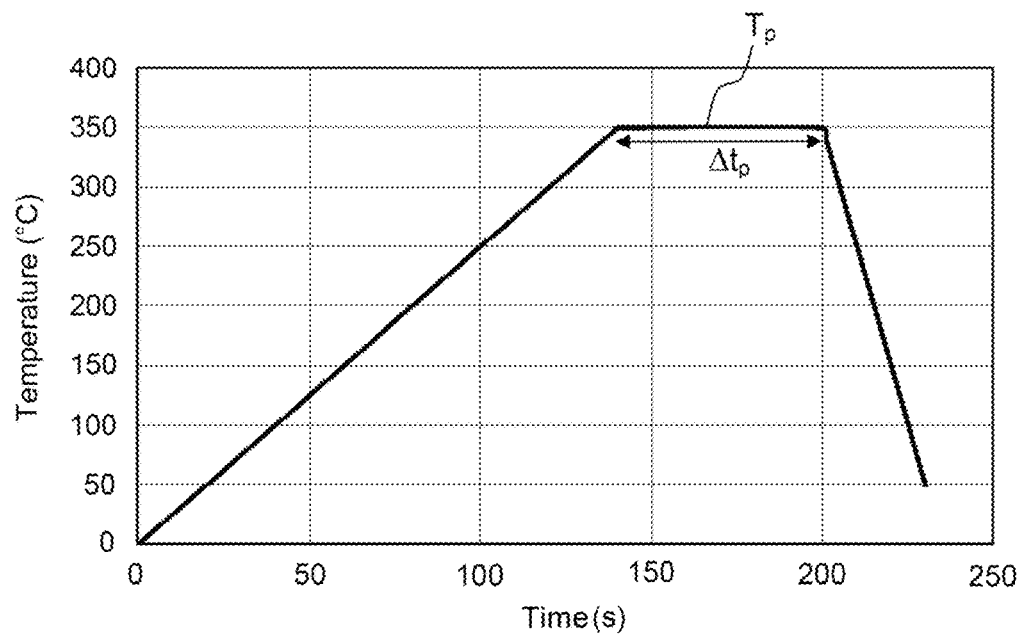
FIGS. 4a and 4b illustrate two options of the invention with one annealing ramp or two annealing ramps, in the case of a 10 nm Ni deposit.
Figure 4B:
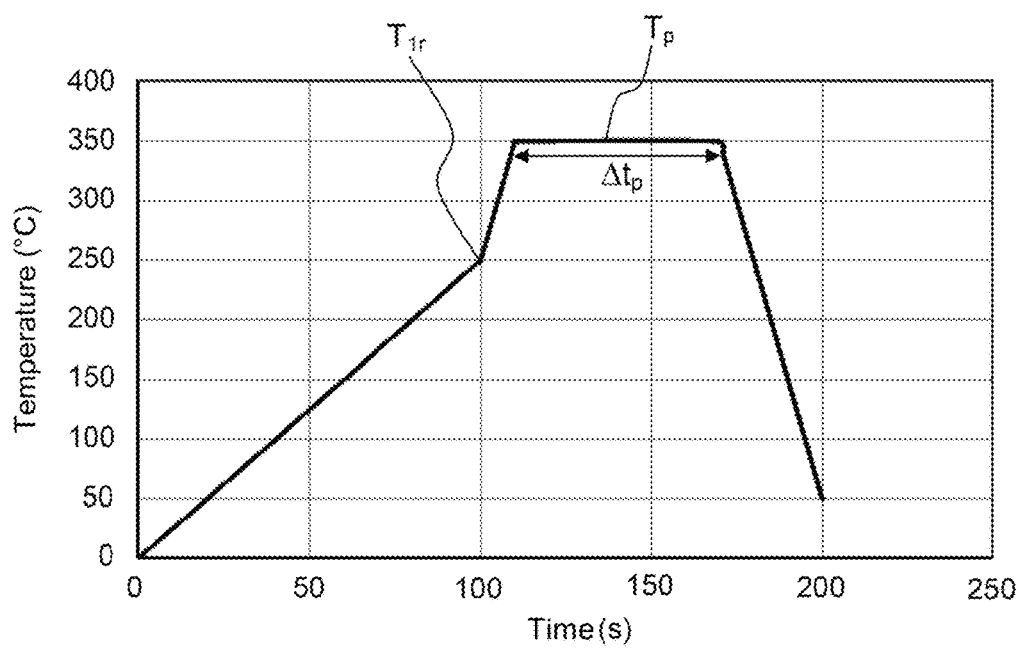

FIGS. 4a and 4b illustrate these two options, in the case of a 10 nm Ni deposit.

The temperature range of lower contact resistance lies between 300° C. and 350° C.

It is necessary to have obtained a complete consumption of Ni in the range 200° C. and 320° C., with a preference for the range 240° C. and 290° C. to avoid forming the second texture referred to as texture B.

One overall method consists in measuring the thickness of intermetallic compound formed (or of the Ni consumed) as a function of the time for various annealing temperatures. This thickness measurement can be carried out by various characterization methods: by x-ray reflectivity (XRR) analysis, by ellipsometry, microscopy, etc. or any method that makes it possible to extract the thickness of the intermetallic compound and that of the Ni. The thickness L of intermetallic compound formed is generally proportional to the rate of formation D multiplied by the time t, it all being to the power n (n being between ½ and 4) as defined below:

$$L=(D \cdot t)^n$$

According to the method described above, it is therefore easily possible to determine the rates of formation for various temperatures and by modeling in order to obtain the time required to completely consume the nickel for a given initial thickness and a given annealing temperature.

Thus, according to this methodology and from data collected from the literature, as described in the publications by J. S. Solomon and S. R. Smith, J. Vac. Sci. Technol. A 5 (1987) 1809 and by H. F. Chuang et al., J. Electron. Mater. 24 (1995) 767, More specifically, Chuang et al. measure thicknesses of GaAs consumed for a temperature and various times, Solomon and Smith measure Ni concentration gradients as a function of the temperature for a given time. Both deduce therefrom coefficients for diffusion of Ni in GaAs (or rate of formation).

The Applicant carried out various studies to determine the parameters that make it possible to optimize the annealing operation while only forming the first texture A, and avoiding forming the second texture B.

FIGS. 5a-5c, 6a-6c, 7a-7c illustrate the appearance of the second texture above the nucleation temperature of the second texture, as a function of the annealing rate and as a function of the thickness of Ni deposited.

Figure 5A:
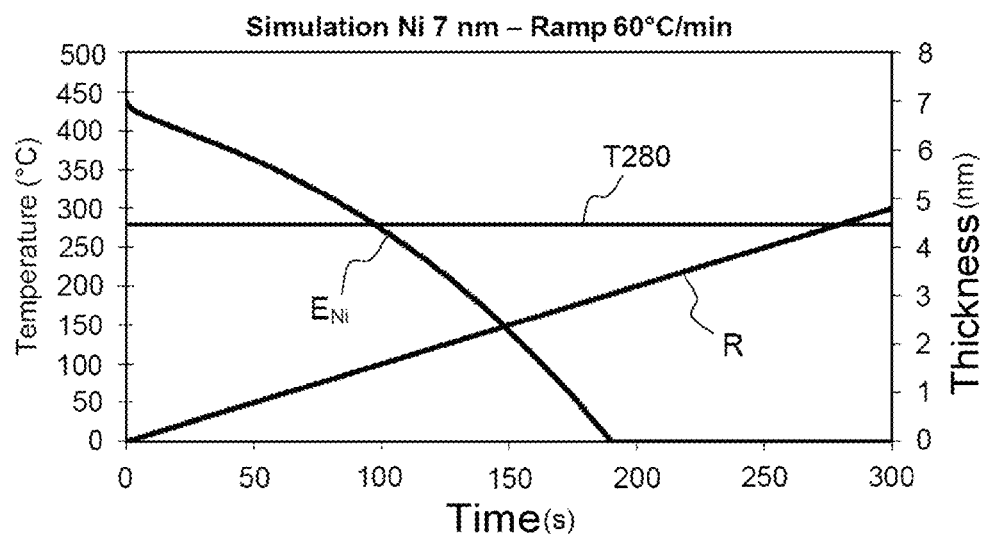
FIGS. 5a-5c illustrate the appearance of the second texture above the nucleation temperature of the second texture, as a function of the annealing rate for an Ni thickness of 7 nm.
Figure 5B:
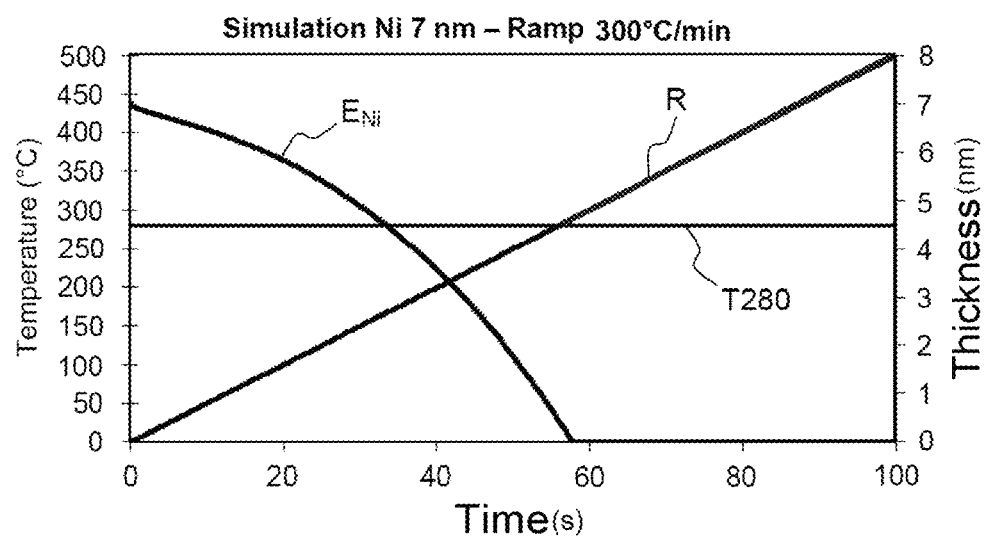
Figure 5C:
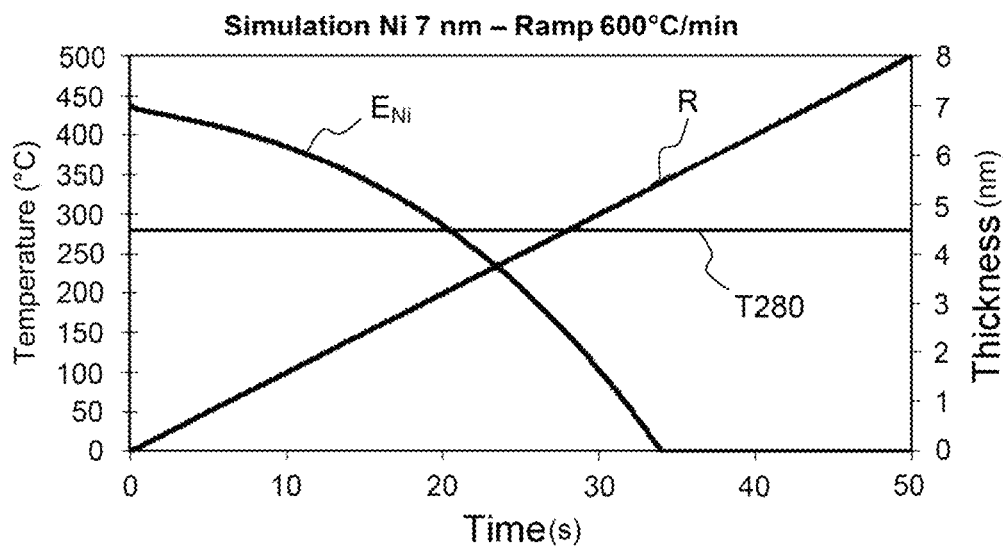
Figure 6A:
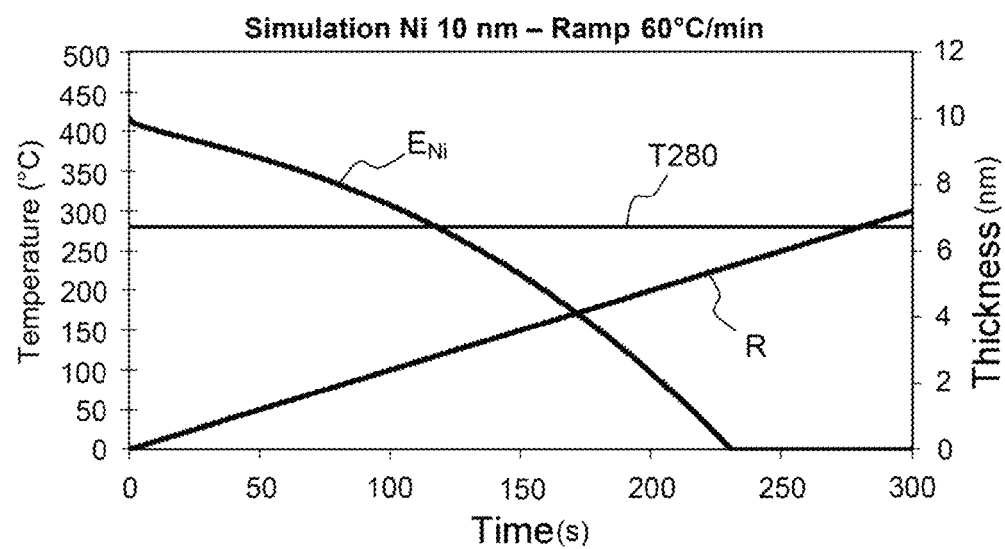
FIGS. 6a-6c illustrate the appearance of the second texture above the nucleation temperature of the second texture, as a function of the annealing rate for an Ni thickness of 10 nm.
Figure 6B:
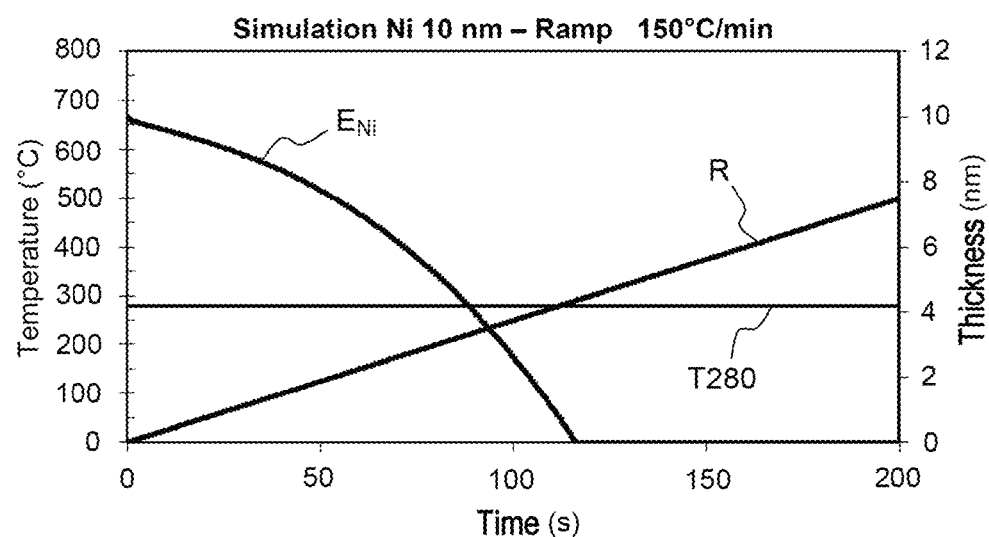
Figure 6C:
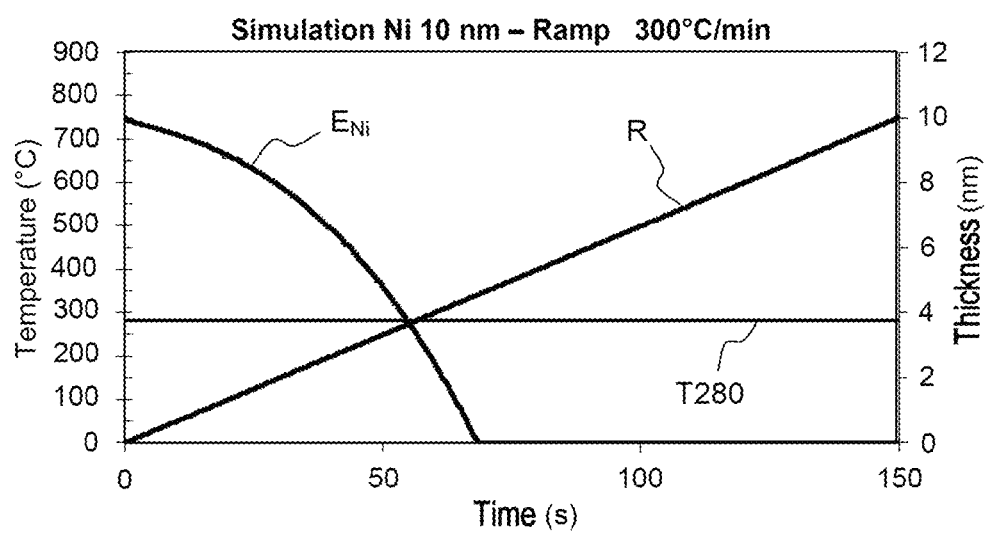
Figure 7A:
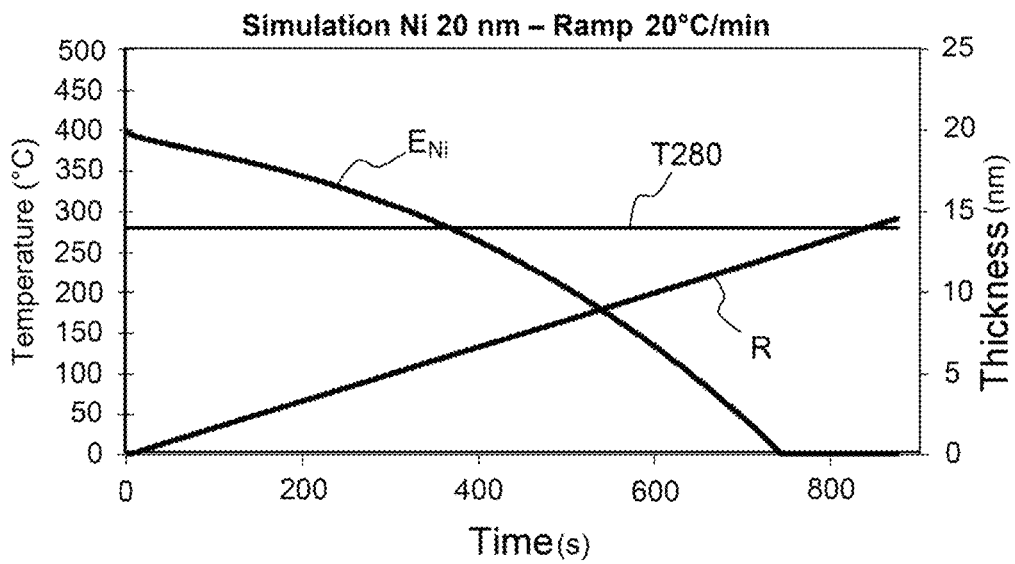
FIGS. 7a-7c illustrate the appearance of the second texture above the nucleation temperature of the second texture, as a function of the annealing rate for an Ni thickness of 20 nm.
Figure 7B:
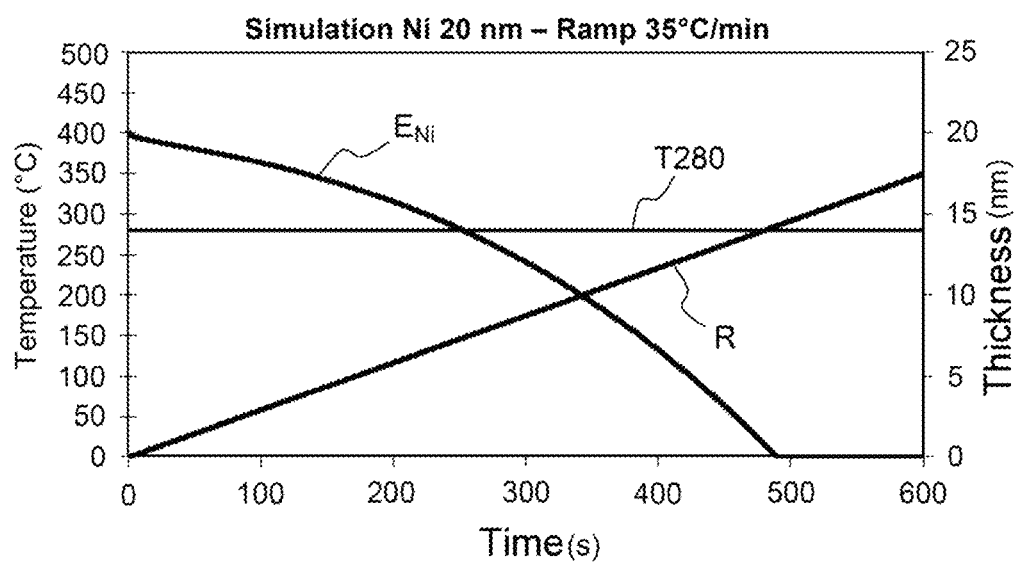
Figure 7C:
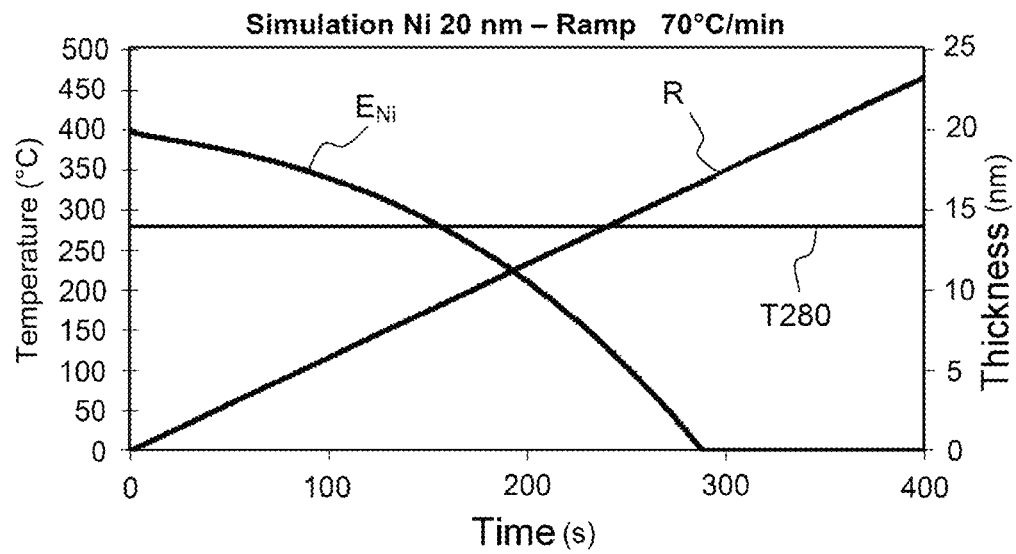
Figure 8A:
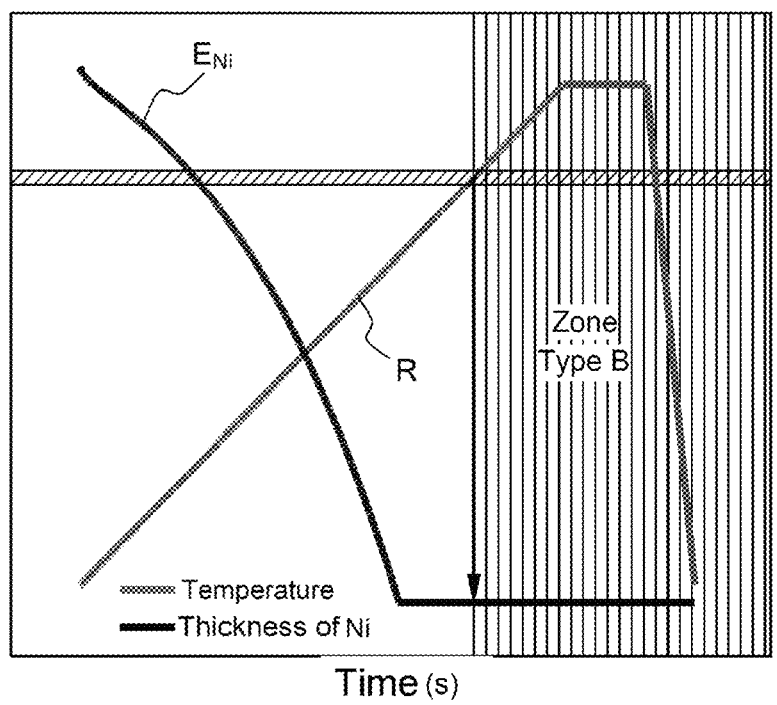
FIGS. 8a-8c generically illustrate the preceding figures, depicting by hatched zones the zones to exclude (zone where the texture B is capable of being formed)
Figure 8B:
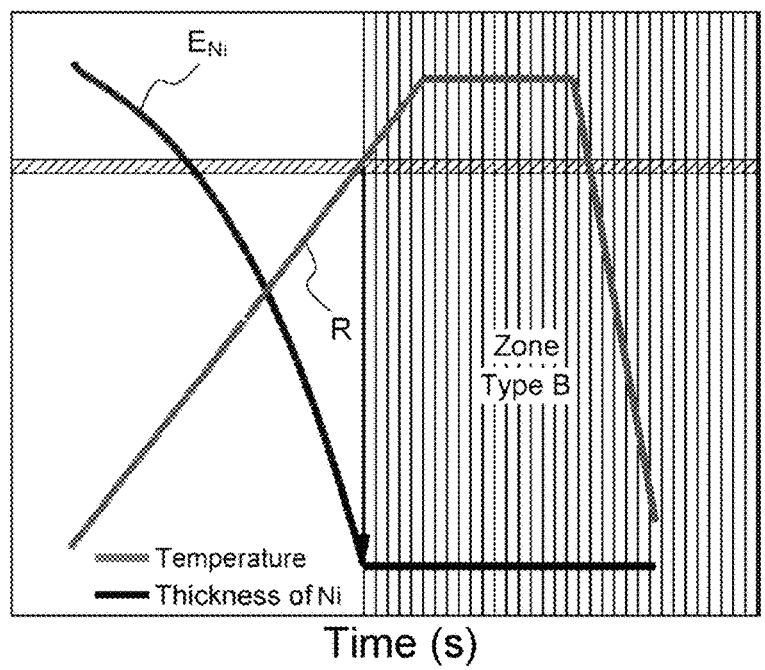
Figure 8C:
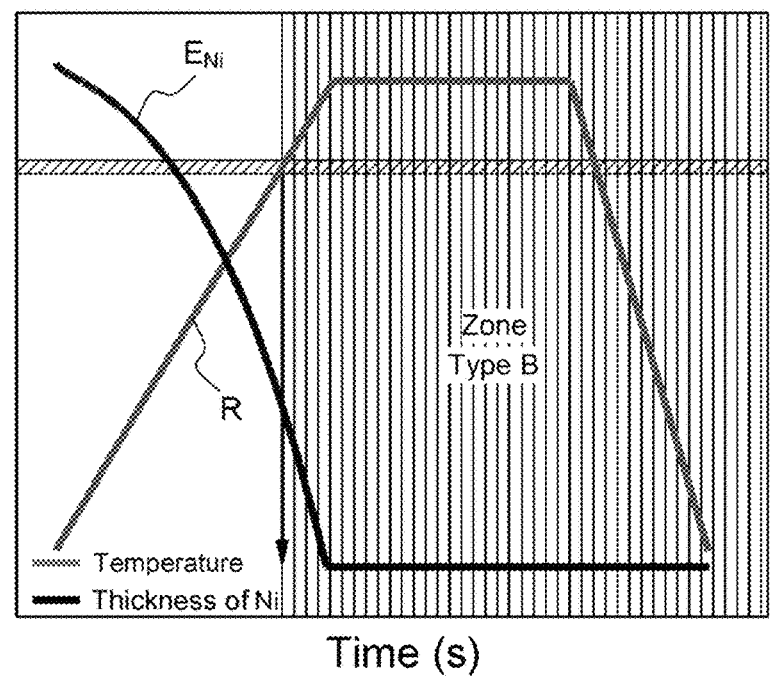

More specifically:
FIGS. 5a-5c relate to an Ni thickness of 7 nm;
FIGS. 6a-6c relate to an Ni thickness of 10 nm;
FIGS. 7a-7c relate to an Ni thickness of 20 nm.
FIGS. 8a-8c generically illustrate the preceding figures, depicting by hatched zones the zones to exclude (zone where the texture B is capable of being formed if nickel is present). More specifically, the curves $E_{Ni}$ relate to the Ni thickness as a function of time, the straight lines R relate to the temperature ramps.

The horizontal gray hatched band corresponds to the nucleation temperature $T_{nucl}$ of type B of the second texture.

The hatched zone corresponds to the potential zone where the type of second texture B may grow if it intercepts the curve $E_{Ni}$ of the Ni before complete consumption.

The curve representing the ramp R should cross the nucleation zone (hatched zone) once all the Ni is consumed (curve $E_{Ni}$) in order to favor only the formation of the first texture of type A.

FIG. 8a corresponds to a case 1: with a slow ramp and the formation only of the first texture. FIG. 8b corresponds to a case 2: with a maximum ramp and again the formation only of the first texture.

FIG. 8c corresponds to a case 3: with too fast a ramp and the formation of the first texture A and of the second texture B.

The Applicant was thus able to establish the table below linking the maximum ramps (corresponding to a maximum temperature rise rate) as a function of the thickness.

| Thickness (nm) | Maximum ramp (° C./min) |
|---|---|
| 5 | 550 |
| 6 | 417 |
| 7 | 300 |
| 8 | 225 |
| 9 | 185 |
| 10 | 150 |
| 11 | 124 |
| 12 | 105 |
| 13 | 88 |
| 15 | 66 |
| 17 | 52 |
| 20 | 35 |

The greater the thickness, the lower the ramp must be and therefore the more a long annealing time is needed.

The function that links the maximum ramp (in ° C./min) that can be used with the thickness of Ni deposited (in nm) is a power function:

$$y=12314.7x^{-1.91582}$$

The coefficients of this function are dependent on the kinetics of the phase that is formed.

Figure 9:
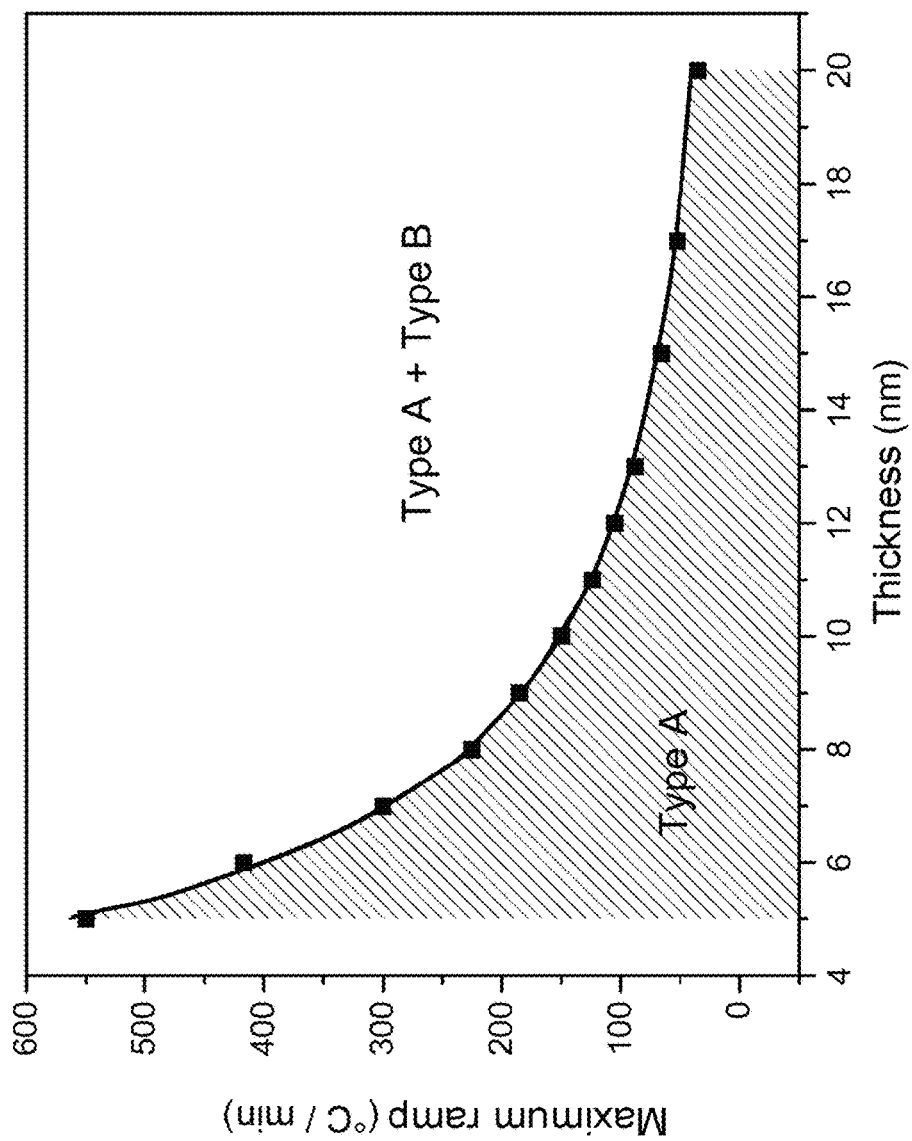
FIG. 9 illustrates the function that the Applicant established, that provides this maximum annealing rate $V_{max}$ (in ° C./min) as a function of the thickness of Ni (in nm)

FIG. 9 illustrates the relationship that the Applicant established, that provides this maximum rate $V_{max}$ (in ° C./min) as a function of the thickness of Ni (in nm).

Examples of ramps and hold times are provided below in the case of a single ramp The Applicant provides ranges of times (it is indicated that the total ramp+hold times do not incorporate the cooling times, the hold time being 60 s). The minimum time typically corresponds to the slope $V_{max}$ of the maximum case.

For an Ni Thickness of 7 nm:
Minimum time: 70 s
Ramp rate: 300° C./min
Total time: 130 s
For an Ni Thickness of 10 nm:
Minimum time: 140 s
Ramp rate: 150° C./min
Total time: 200 s
For an Ni Thickness of 20 nm:
Minimum time: 600 s
Ramp rate: 35° C./min
Total time: 660 s Examples of ramps and hold times are provided below in the case of two ramps:

The advantage of a double ramp lies in the fact of reducing the total time of the minimum case (for a given thickness).

For an Ni Thickness of 7 nm:
Minimum time: 56 s
R1 ramp rate: 300° C./min
R2 ramp time: 10 s
Total time: 126 s
For an Ni Thickness of 10 nm:
Minimum time: 112 s
R1 ramp rate: 150° C./min
R2 ramp time: 10 s
Total time: 182 s
For an Ni Thickness of 20 nm:
Minimum time: 480 s
R1 ramp rate: 35° C./min
R2 ramp time: 10 s
Total time: 550 s The Applicant provides an estimation of the annealing time needed to completely consume a layer of Ni at various annealing temperatures (150, 200, 250 and 300° C.) for the Ni—GaAs system (case where x=0). Specifically, there is a proportionality between the thickness of intermetallic compound and the initial thickness of Ni deposited.

Table 1 below lists all of the results for various initial thicknesses of Ni.

TABLE 1

| Annealing temperature | Initial Ni thickness | | |
|---|---|---|---|
| | 5 nm | 10 nm | 50 nm |
| 150° C. | 2.8 min | 11.2 min | 277.4 min |
| 200° C. | 1.4 min | 5.8 min | 140.4 min |
| 250° C. | 0.8 min | 3.2 min | 75.6 min |
| 300° C. | 0.6 min | 1.8 min | 43.2 min |

It should be noted that different rates of formation are found depending on the publications that may be explained by the uncertainty regarding the measurement of the thickness and the uncertainty regarding the annealing temperature.

It is therefore necessary to produce these nomograms by taking into account the equipment used.

It has furthermore been reported that the diffusion of Ni in the GaAs compound or the diffusion of Ni in the $In_{0.53}Ga_{0.47}As$ compound were very similar in the article by Y. Ashizawa et al., J. Electron. Mater. 25 (1996) 715; this is why it is possible to consider that the orders of magnitude of the preceding data (reported in Table 1) may also be valid, more generally, for the generic Ni—InGaAs intermetallic compound.

According to the present invention, it is therefore proposed to establish nomograms that define, for a given thickness of Ni, the pair of parameters: annealing temperature/annealing time in order to completely consume a given thickness of Ni and to apply these pairs of parameters in order to result in the formation of an intermetallic compound of good texture, i.e. the first texture A having optimal contact surface properties.

According to the process of the present invention, it is thus possible to control the texture making it possible to guarantee the best contact, the metal/semiconductor ($In_xGa_{1-x}As$ in the present case) contact resistance being dependent on the Schottky barrier height and therefore on the phase, therefore on the stoichiometry, in contact with the semiconductor.

The Applicant has shown that in the system considered several phases may be formed: $Ni_3InGaAs$, $Ni_2InGaAs$, NiAs.

The Applicant is interested in the first phase and the texture A.

Figure 10:
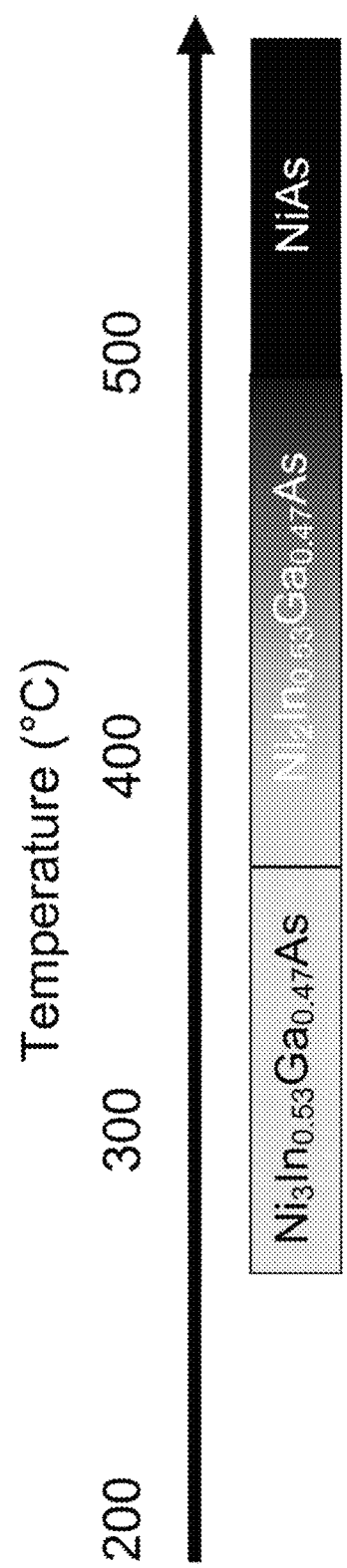
FIG. 10 illustrates the various phases of intermetallic compounds formed as a function of the temperature in the case of a solid reaction between Ni and $In_xGa_{1-x}As$.

Obtaining the texture A is carried out with a small thermal budget and the $Ni_3InGaAs$ phase requires an annealing having a temperature below 350° C. FIG. 10 illustrates, for this purpose, the change in the formation of the various phases that may be obtained during solid reactions in the presence of Ni and $In_{0.53}Ga_{0.47}As$, also referred to as phase sequence.

Figure 11:
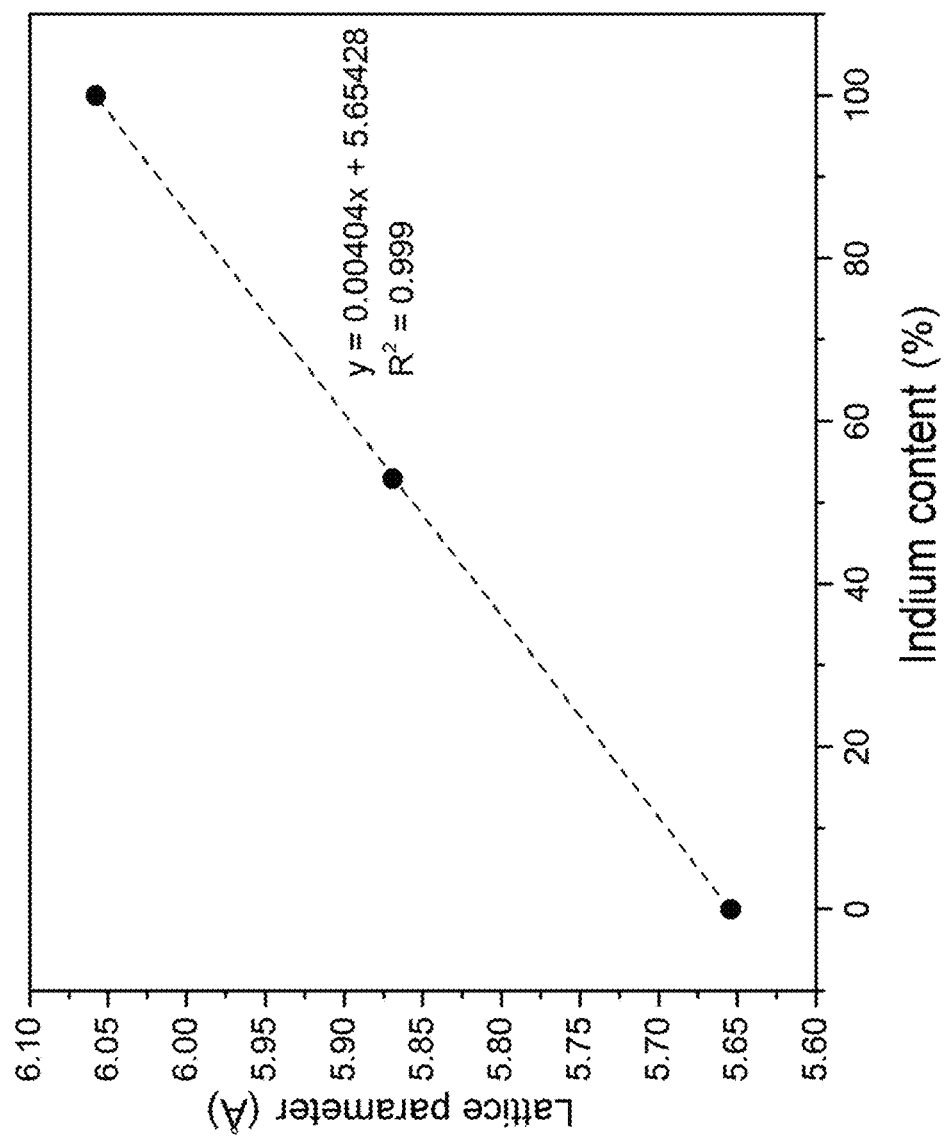
FIG. 11 illustrates the change in the lattice parameter of the $In_xGa_{1-x}As$ substrate as a function of the indium content (x)

The Applicant also analyzed the change in the lattice parameter of the $In_xGa_{1-x}As$ substrate as a function of the content of indium (x) reported in FIG. 11 in order to estimate a range of favored molar fractions in the composition of the substrate for which the present invention is particularly suitable.

This change is based on the application of Vegard's law between the 2 extreme cases GaAs and InAs and also the intermediate composition $In_{0.53}Ga_{0.47}As$.

With the aid of the straight-line equation taken from figure A, the lattice parameter of the $In_xGa_{1-x}As$ substrate was able to be calculated for x varying from 0 to 100 then the interplanar spacing between the (110) and (111) planes was calculated according to the standard formula for a cubic lattice:

$$\frac{1}{d^2} = \frac{h^2 + k^2 + l^2}{a^2}.$$

The results are reported in Table A which provides the value of the interplanar spacings for the (110) and (111) planes of the $In_xGa_{1-x}As$ substrate as a function of the content of indium (x).

TABLE A

| % In | a | d(110) | d(111) |
|---|---|---|---|
| 0 | 5.6543 | 3.9981 | 3.2645 |
| 5 | 5.6743 | 4.0123 | 3.2760 |

TABLE A-continued

| % In | a | d(110) | d(111) |
|---|---|---|---|
| 10 | 5.6943 | 4.0264 | 3.2876 |
| 15 | 5.7143 | 4.0406 | 3.2991 |
| 20 | 5.7343 | 4.0547 | 3.3106 |
| 25 | 5.7543 | 4.0689 | 3.3222 |
| 30 | 5.7743 | 4.0830 | 3.3337 |
| 35 | 5.7943 | 4.0971 | 3.3453 |
| 40 | 5.8143 | 4.1113 | 3.3568 |
| 45 | 5.8343 | 4.1254 | 3.3684 |
| 50 | 5.8543 | 4.1396 | 3.3799 |
| 55 | 5.8743 | 4.1537 | 3.3915 |
| 60 | 5.8943 | 4.1678 | 3.4030 |
| 65 | 5.9143 | 4.1820 | 3.4146 |
| 70 | 5.9343 | 4.1961 | 3.4261 |
| 75 | 5.9543 | 4.2103 | 3.4377 |
| 80 | 5.9743 | 4.2244 | 3.4492 |
| 85 | 5.9943 | 4.2386 | 3.4608 |
| 90 | 6.0143 | 4.2527 | 3.4723 |
| 95 | 6.0343 | 4.2668 | 3.4839 |
| 100 | 6.0543 | 4.2810 | 3.4954 |

The $Ni_3In_{0.53}Ga_{0.47}As/In_{0.53}Ga_{0.47}As$ reference intermetallic has the following lattice parameters (hexagonal lattice): a=3.87 and c=5.03. From these parameters, it is possible to calculate the interplanar spacings for the (10$\bar{1}$0) and (0001) planes of the intermetallic that correspond respectively to the textures A and B: 3.3515 Å and 5.03 Å.

Figure 12:
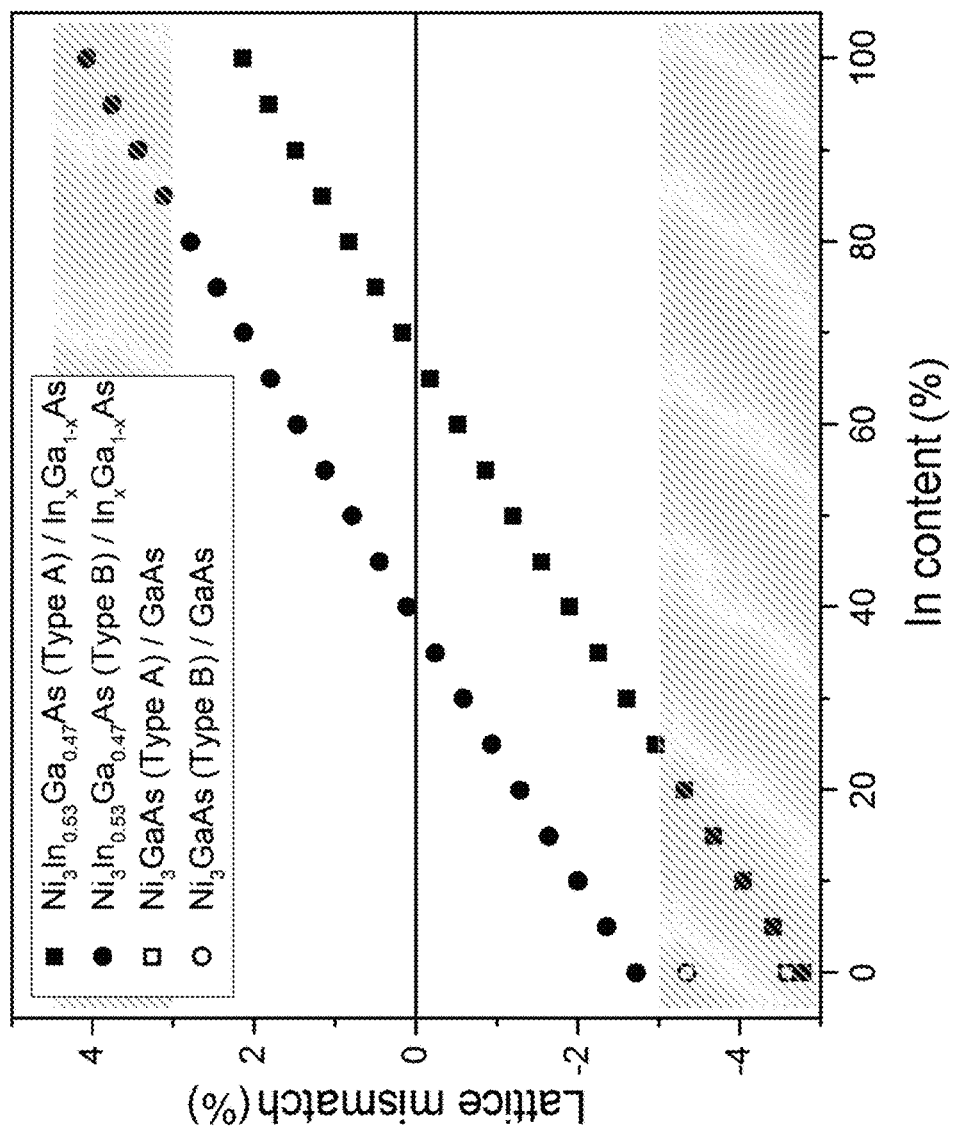
FIG. 12 illustrates the change in the lattice mismatch for the 2 textures of the $Ni_3In_{0.53}Ga_{0.47}As$ intermetallic as a function of the indium content of the substrate.

For this reference intermetallic, it is possible to calculate the lattice mismatch for each of the two textures as a function of the indium content of the substrate. This is illustrated by FIG. 12. The lattice mismatch for the texture A is calculated relative to the (110) plane of the substrate. As regards the lattice mismatch for the texture B, it is calculated relative to the (111) plane of the substrate. The larger the absolute value of the lattice mismatch, the lower the probability of forming such and such a texture. Specifically, the increase in the lattice mismatch leads to an increase in the energy difference between the intermetallic and the substrate. Two shaded areas defined on FIG. 6 represent areas where the probability that the texture in question exists is low. Thus, below an indium content of 25%, the probability of forming the texture A is lower and above an indium content of 80%; it is the formation of the texture B that is the least favorable. This figure is constructed from an approximation: it is the $Ni_3In_{0.53}Ga_{0.47}As$ reference intermetallic that is used to evaluate the lattice mismatch irrespective of the indium content. Yet the stoichiometry of the intermetallic changes as a function of the indium content of the substrate (for example, the $Ni_3In_{0.7}Ga_{0.3}As$ intermetallic is formed on a substrate containing 70% indium). In order to verify that this approximation is valid, two other points were added to FIG. 12, these are lattice mismatch values for the $Ni_3GaAs$ intermetallic on GaAs. The values obtained are relatively similar and in any case are consistent with those obtained for the $Ni_3In_{0.53}Ga_{0.47}As$ intermetallic. Thus, despite the approximation made, the "limits" of coexistence of the two textures (25%<x<80%) appear preferential.

Example of a process of the invention comprising the production of an intermetallic contact formed from Ni on an $In_{0.53}Ga_{0.47}As$ substrate:

The process comprises the following steps:
a step of cleaning the substrate;
a step of metal deposition of Ni;
one or more annealing steps enabling the formation of an intermetallic compound with the texture A at low temperature and by consuming all the Ni present.

Cleaning Step:

A surface of an $In_{0.53}Ga_{0.47}As$ substrate is treated with an $HCl:H_2O$ (1:10 to 1:2, preferentially 1:10) solution for 45 to 60 s in order to remove the native oxides ($In_2O_3$, $Ga_2O_3$, $As_2O_3$, $As_2O_5$, etc.). The $In_{0.53}Ga_{0.47}As$ semiconductor layer is then treated in an cleaning chamber in situ (commonly referred to as a preclean) by an Ar or He plasma in order to remove the possible oxides that might have regrown between the liquid phase (commonly referred to as WET) treatment and the placing of the samples under vacuum before deposition of the metal.

Metal Deposition Step:

Without exposing the sample to air, Ni (7 to 80 nm) is deposited on the $In_{0.53}Ga_{0.47}As$ layer. A protective layer which may be TiN (7 nm or more) can advantageously be deposited in order to protect the sample from a possible oxidation at the surface of the metal or at the metal/semiconductor interface.

Annealing Step(s):

The metal layer/semiconductor substrate assembly is treated during an annealing step under a controlled atmosphere. It is the execution of this annealing step that is essential for controlling the texture and the phase of the intermetallic that will be formed.

The Applicant has shown that the intermetallic compound that has the best performance (interface roughness and contact resistivity) may be obtained by means of a one-step or two-step process (with or without complete consumption of the Ni). In the case of 2 steps without complete consumption of the Ni, a step of selective shrinkage is essential.

The first step (low-temperature annealing) makes it possible to control the texture of the intermetallic and therefore the morphology of the interface.

A high-temperature second annealing step makes it possible to optionally change the phase formed during the first step to the least resistive phase without modifying its texture (and therefore the interface morphology).

More specifically, the Applicant has shown that in order to favor the texture that will make the intermetallic compound grow parallel to the substrate (as opposed to the texture that results in a pyramidal material being obtained) it was necessary to heat the sample at low temperature (200° C. and 320° C., with a preference for the range 240° C. and 290° C.) for a long enough time to enable the diffusion and the complete consumption of the Ni (this time depends on the initial Ni layer thickness, it may vary from a few minutes for a 7 nm layer to a few tens of minutes for an 80 nm layer). The $Ni_3InGaAs$ phase is obtained during this annealing.

Once the Ni film is completely consumed, a second annealing of RTA (Rapid Thermal Annealing) type can be carried out in order to control the phase of the intermetallic compound: 250≤RTA<350° C. to obtain the $Ni_3In_{0.53}Ga_{0.47}As$ phase or 350≤RTA<500° C. to obtain the $Ni_2In_{0.53}Ga_{0.47}As$ phase. From a contact resistivity point of view, the $Ni_3In_{0.53}Ga_{0.47}As$ phase however appears the most favorable. Above 500° C., a rejection of the Ga and In atoms is observed which results in the obtention of InAs clusters which is clearly not favorable in terms of contact resistivity.

Figure 13:
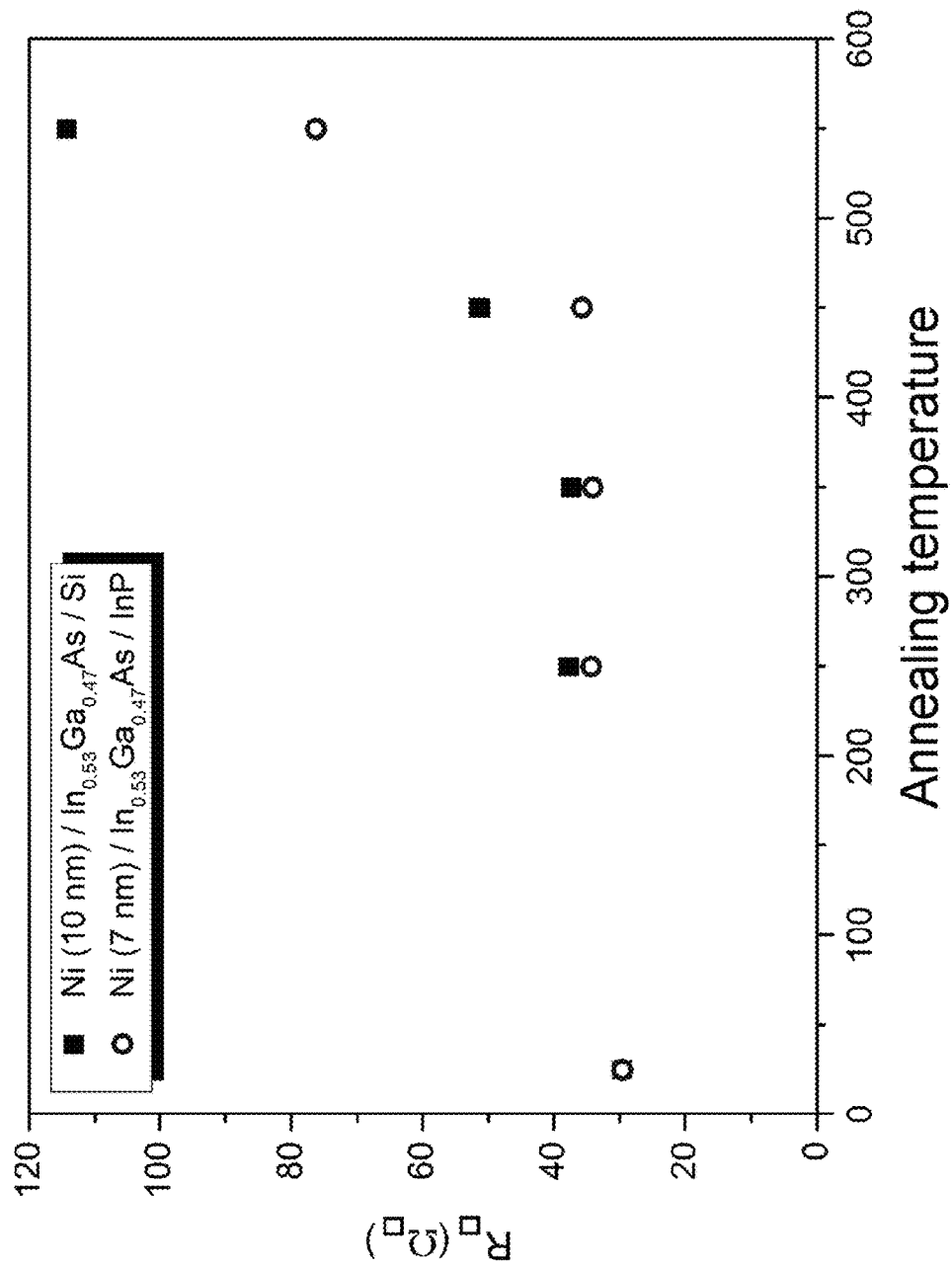
FIG. 13 illustrates the change in the contact sheet resistance of an example of a layer formed of Ni—$In_{0.53}Ga_{0.47}As$ as a function of the annealing temperature.

FIG. 13 shows the results of measuring contact sheet resistances as a function of the annealing temperature for:
a metal deposition of Ni having an initial thickness of 10 nm on an $In_{0.53}Ga_{0.47}As$ on Si stack;
a metal deposition of Ni having an initial thickness of 7 nm on an $In_{0.53}Ga_{0.47}As$ on InP stack.

It appears that the sheet resistances obtained are actually lower up to annealing temperatures below 500° C., advantageously below 450° C.

Figure 14:
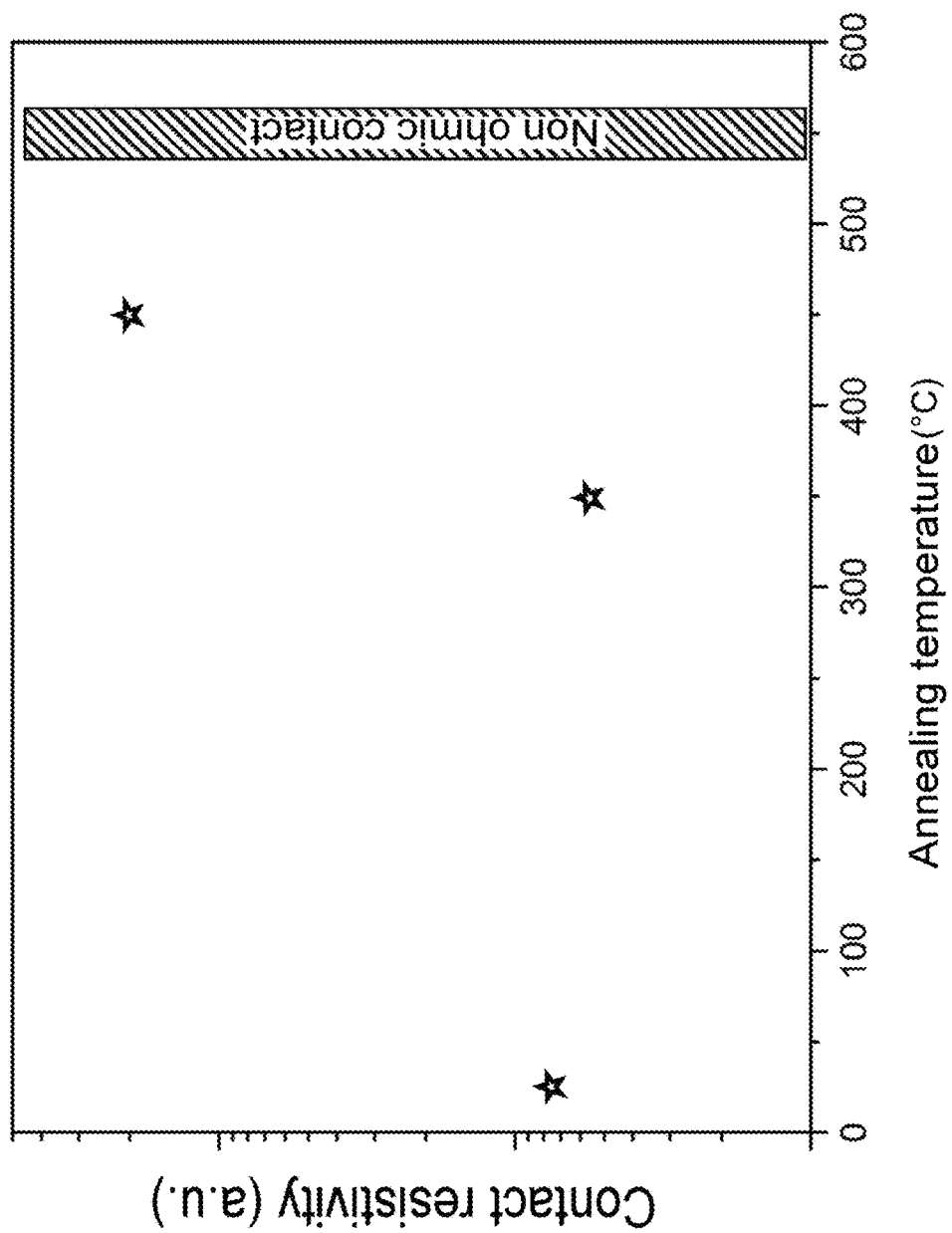
FIG. 14 illustrates the change in the contact resistivity of an example of a layer formed of Ni—$In_{0.53}Ga_{0.47}As$ as a function of the annealing temperature.

FIG. 14 shows the results obtained for the contact resistivity within the context of Ni (20 nm) on an $In_{0.53}Ga_{0.47}As$/InP stack. It also appears that the contact resistivity is low enough with compounds obtained with annealing temperatures below 500° C., advantageously below 450° C.

The invention claimed is:

1. A process for manufacturing an intermetallic contact on the surface of a layer or of a substrate of oriented $In_xGa_{1-x}As$ material with $0 \leq x \leq 1$, said contact comprising an Ni—InGaAs intermetallic compound, said intermetallic compound having a hexagonal crystallographic structure that may have:
    a first texture, of which $(10\bar{1}0)$ planes of the intermetallic compound are parallel to the surface of said layer or of said substrate, and which is formed at a first nucleation temperature or
    a second texture, of which the (0001) planes of the intermetallic compound are parallel to the planes of said layer or of said substrate, and which is formed at a second nucleation temperature above said first nucleation temperature;
    said process comprising the following steps:
        the production of nomograms defining, for a thickness of Ni deposited on said $In_xGa_{1-x}As$ material, the time required to completely consume the initial thickness of Ni deposited on said $In_xGa_{1-x}As$ material as a function of the annealing temperature, said annealing temperature being below said nucleation temperature of said second texture;
        the localized deposition of Ni on the surface of said $In_xGa_{1-x}As$ material in order to form a layer of Ni having a contact thickness;
        an annealing step applying the pair of parameters: time required/annealing temperature, deduced from said nomograms in correlation with said contact thickness so as to form, by solid-state reaction, a layer of intermetallic compound of first texture, said annealing step comprising:
        at least one temperature rise step with a given temperature rise rate that makes it possible to achieve a final annealing temperature ($T_p$) and
        at least one temperature hold of said final annealing temperature ($T_p$), for a hold time ($\Delta t_p$).

2. The process for manufacturing an intermetallic contact according to claim 1, wherein the temperature rise rate is determined as being below a maximum rate $V_{max}$ (in ° C./min), said maximum rate being defined by the following function as a function of the thickness x (in nm) of Ni deposited:

$$V_{max} = 12314.7 x^{-1.91582}$$

3. The process for manufacturing an intermetallic contact according to claim 1, wherein said annealing step comprises:
    a first temperature rise step with a first temperature rise rate that makes it possible to achieve a first annealing temperature ($T_{1r}$);
    a second temperature rise step with a second temperature rise rate that makes it possible to achieve, from said first annealing temperature, a final annealing temperature ($T_p$);
    at least one temperature hold of said final annealing temperature ($T_p$), for a hold time ($\Delta t_p$).

4. The process for manufacturing an intermetallic contact according to claim 1, wherein the molar fraction x of the substrate is between 0.25 and 0.80.

5. The process for manufacturing an intermetallic contact according to claim 1, comprising a first annealing at a first temperature for a first time in order to form a first intermetallic compound of first texture and having a first phase and a second annealing at a higher temperature than said first temperature in order to form a second intermetallic compound of first texture and having a second phase.

6. The process for manufacturing an intermetallic contact according to claim 1, comprising an annealing carried out at a temperature between 200° C. and 320° C., with a preference for the range 240° C. and 290° C., for a time dependent on the thickness of Ni deposited, in order to form an $Ni_3InGaAs$ intermetallic compound.

7. The process for manufacturing an intermetallic contact according to claim 6, wherein, the initial thickness of Ni being between a few nanometers and a few tens of nanometers, the annealing time varies between a few minutes and a few tens of minutes.

8. The process for manufacturing according to claim 6, wherein said annealing carried out at a temperature between 200° C. and 320° C., with a preference for the range 240° C. and 290° C., is followed by an annealing carried out at a temperature between 250° C. and 550° C. in order to modify the resistivity of said intermetallic contact formed.

9. The process according to claim 7, wherein said annealing carried out at a temperature between 200° C. and 320° C., with a preference for the range 240° C. and 290° C., is followed by an annealing carried out at a temperature between 250° C. and 350° C. in order to form an $Ni_3InGaAs$ compound.

10. The process for manufacturing an intermetallic contact according to claim 1, wherein the nomograms are produced by measuring the intermetallic compound thicknesses formed as a function of time.

11. The process for manufacturing an intermetallic contact according to claim 10, wherein the thickness measurements are performed by x-rays.

12. The process for manufacturing an intermetallic contact according to claim 10, wherein the thickness measurements are performed by ellipsometry.

13. The process for manufacturing an intermetallic contact according to claim 1, comprising the deposition of a protective layer on the surface of the localized deposition of Ni, prior to the annealing operation(s).

14. An intermetallic contact obtained according to the process of claim 1.

15. A process for manufacturing a transistor comprising the process for manufacturing an intermetallic contact according to claim 1.

16. A process for manufacturing a photonic component comprising the process for manufacturing an intermetallic contact according to claim 1.

* * * * *